(12) United States Patent
Shih

(10) Patent No.: US 7,471,727 B2
(45) Date of Patent: Dec. 30, 2008

(54) INTEGRATED SERIAL DATA DECODER

(75) Inventor: Cheng Ming Shih, Taipei (TW)

(73) Assignee: Princeton Technology Corporation, Taipei County (TW)

( * ) Notice: Subject to any disclaimer, the term of this patent is extended or adjusted under 35 U.S.C. 154(b) by 597 days.

(21) Appl. No.: 11/139,639

(22) Filed: May 31, 2005

(65) Prior Publication Data

US 2006/0268998 A1 Nov. 30, 2006

(51) Int. Cl.
*H04B 14/04* (2006.01)
(52) U.S. Cl. .................................. 375/242; 375/368
(58) Field of Classification Search ................ 375/242, 375/368, 262, 265, 341, 324, 340; 714/731, 714/744, 795, 48, 700, 701, 758, 798, 794, 714/799, 813; 327/18, 20, 26, 41, 46, 57, 327/236, 291, 22, 296, 297, 298, 107, 166, 327/176, 386, 391
See application file for complete search history.

(56) References Cited

U.S. PATENT DOCUMENTS

| | | | | | |
|---|---|---|---|---|---|
| 4,393,492 | A | * | 7/1983 | Bishop | 370/225 |
| 5,297,181 | A | * | 3/1994 | Barr et al. | 375/373 |
| 6,339,601 | B1 | * | 1/2002 | Seong et al. | 370/503 |
| 7,190,197 | B1 | * | 3/2007 | You et al. | 327/144 |
| 2004/0108945 | A1 | * | 6/2004 | Hori | 341/63 |
| 2005/0094756 | A1 | * | 5/2005 | Bertram | 375/360 |

* cited by examiner

*Primary Examiner*—David C Payne
*Assistant Examiner*—Rahel Guarino
(74) *Attorney, Agent, or Firm*—Muncy, Geissler, Olds & Lowe, PLLC

(57) ABSTRACT

The present invention provides a serial data decoder without capacitor that can be made in the form of an integrated circuit without any additional external device. The integrated serial data decoder comprises a clock generator, a frame detector and a channel decoder. Demodulated serial data are inputted for being converted into parallel data periodically and repeatedly.

5 Claims, 6 Drawing Sheets

INTEGRATED SERIAL DATA DECODER

FIELD OF THE INVENTION

The present invention relates to a serial data decoder, and more particularly to an integrated serial data decoder without any external device.

BACKGROUND OF THE INVENTION

Referring to FIG. 1, which is a circuit diagram of a conventional serial data decoder. A receiver 1 at left side of the circuit diagram serves to receive and demodulate the signal, and then input a demodulated signal A (serial data) to the serial data decoder 2 that includes a buffer circuit 21; a charging circuit 22 and a decoding circuit 23.

The signal A, as shown in FIG. 2, is a serial data that serves to transmit the previously parallel data periodically in series. In each frame, many previously parallel data are transmitted in series. As shown at the top of FIG. 2, after the signal A of CH1, CH2, CH3, CH4. are transmitted in series, there will be a relative long period of idle time that is called "frame-ending section", and then another frame of serial data transmission will be carried out again.

The signal A of CH1, CH2, CH3, CH4 . . . are inputted to the serial data decoder 2 and reshaped by the buffer circuit 21 and then transmitted to the charging circuit 22. The charging circuit 22 includes resistors, diode and capacitor C1. The signal at point B as shown in FIG. 2 shows the discharging of the capacitor C1. During transmission of the serial data CH1, CH2, CH3, CH4 . . . , the signal at point B keeps staying at a relative high level, while during the frame ending, the capacitor C1 will be completely discharged due to no serial data. After that, another frame of serial data transmission will be carried out again.

The signal at point B is transmitted to the decoding circuit 23 and is converted into the parallel data CH1, CH2, CH3, and CH4 by several D flip-flops 231, 232, 233 and 234. The waveforms of the outputs Q1, Q2, Q3 and Q4 of the D flip-flops 231, 232, 233 and 234 and the waveforms of the parallel data CH1, CH2, CH3, CH4 are shown in FIG. 2.

The defects of this conventional serial data decoder are that the capacitor C1 is too big, and the buffer circuit 21, the charging circuit 22 and the decoding circuit 23 are independent devices external to the receiver 1 and are not easy to be integrated with the receiver 1. Therefore, the circuit is not only big but also high cost.

The present invention has arisen to mitigate and/or obviate the afore-described disadvantages.

SUMMARY OF THE INVENTION

The primary objective of the present invention is to provide a serial data decoder without capacitor that can be made in the form of an integrated circuit without any additional external device.

The integrated serial data decoder comprises a clock generator, a frame detector and a channel decoder, but no capacitor. Demodulated serial data are inputted to the channel decoder, and the channel decoder serves to convert the serial data into parallel data periodically and repeatedly;

The structure of the demodulated serial data includes a data-transmission section and a frame-ending section, periods of the respective serial data signals in data-transmission section are similar and less than a given period of time N, while the time of the frame-ending section is longer than the given period of time N;

The frame detector serves to receive output of the clock generator and the demodulated serial data, and to detect the period of the respective serial data, if the period of the respective serial data is less than the period of time N, it means that the serial data are being transmitted, if no serial data is detected and the period is found to be equal to the given period of time N, that means it is in the frame-ending, therefore, a reset signal will be generated to reset the channel decoder, starting another round of serial data transmission;

The channel decoder comprises a plurality of shift registers, after the demodulated serial data are inputted to the plurality of shift registers, the outputs of two consecutive shift registers will be taken out, and then, after passing through an inverter and an AND gate, a set of parallel data will be generated;

Outputs of the last two shift registers pass through an inverter and an AND gate to take out a time period B4R of the frame-ending section before the reset signal R.

The frame detector includes a counter clear circuit, a frame-ending detector and a counter.

The present invention will become more obvious from the following description when taken in connection with the accompanying drawings, which show, for purpose of illustrations only, the preferred embodiment in accordance with the present invention.

DETAILED DESCRIPTION OF THE PREFERRED EMBODIMENT

Figure 1:
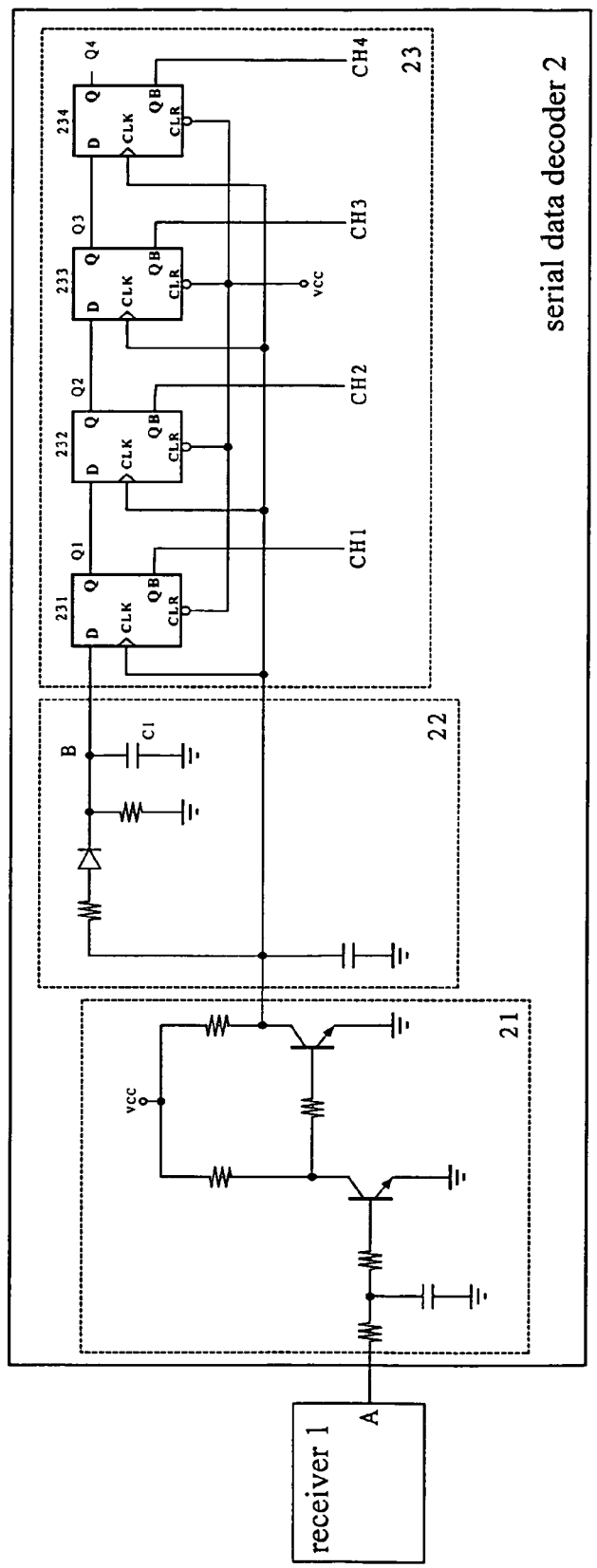
FIG. 1 is a circuit diagram of a conventional serial data decoder.
Figure 2:
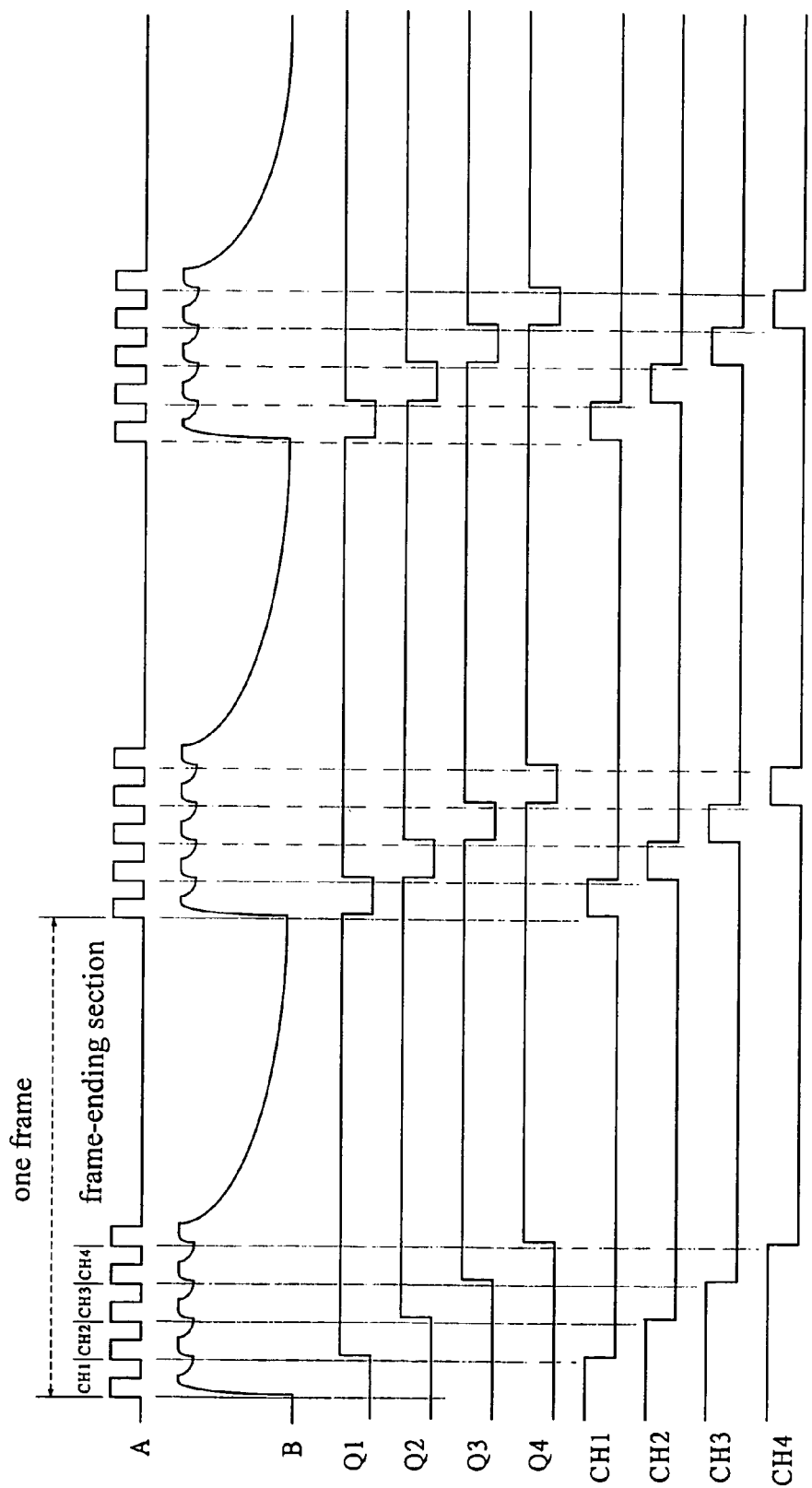
FIG. 2 shows the relative waveforms of the conventional serial data decoder.
Figure 3:
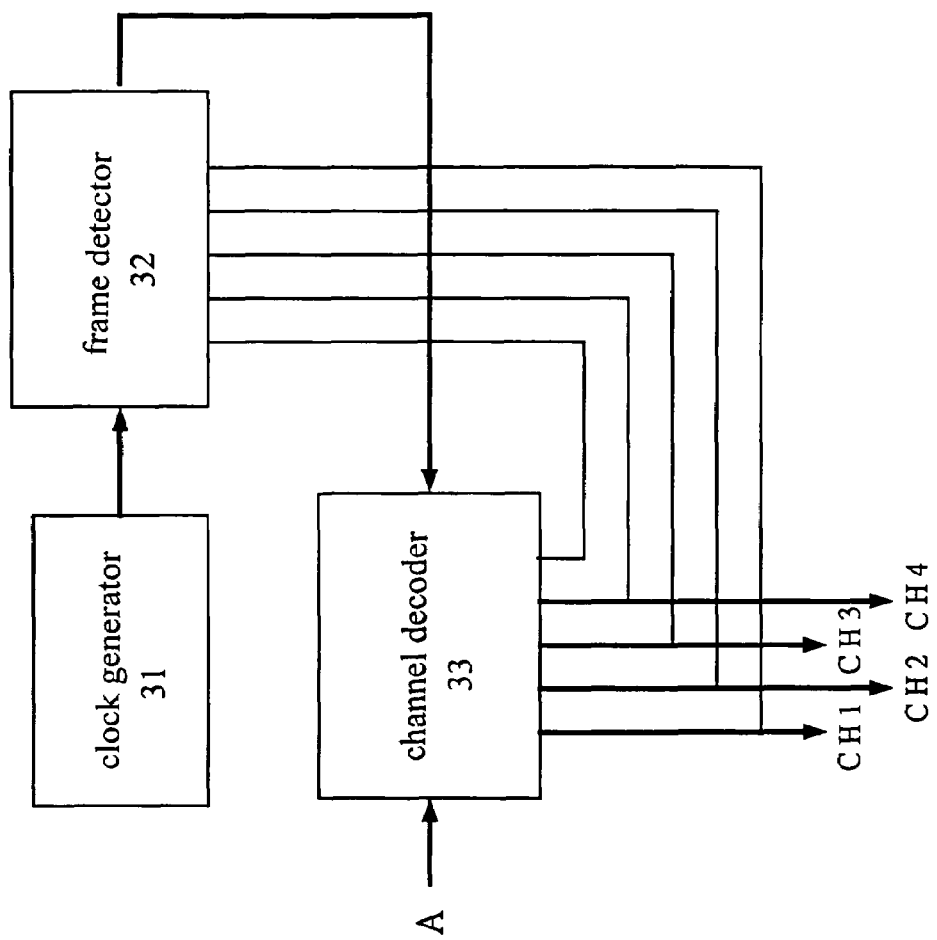
FIG. 3 is a block diagram of a serial data decoder in accordance with the present invention.

Referring to FIG. 3, which is a block diagram of a serial data decoder in accordance with the present invention, which includes a clock generator 31, a frame detector 32 and a channel decoder 33. A demodulated serial data A is inputted from the left to the channel decoder 33, and then is converted into parallel data CH1, CH2, CH3, CH4 by the clock generator 31 and the frame detector 32 periodically and repeatedly.

Figure 4:
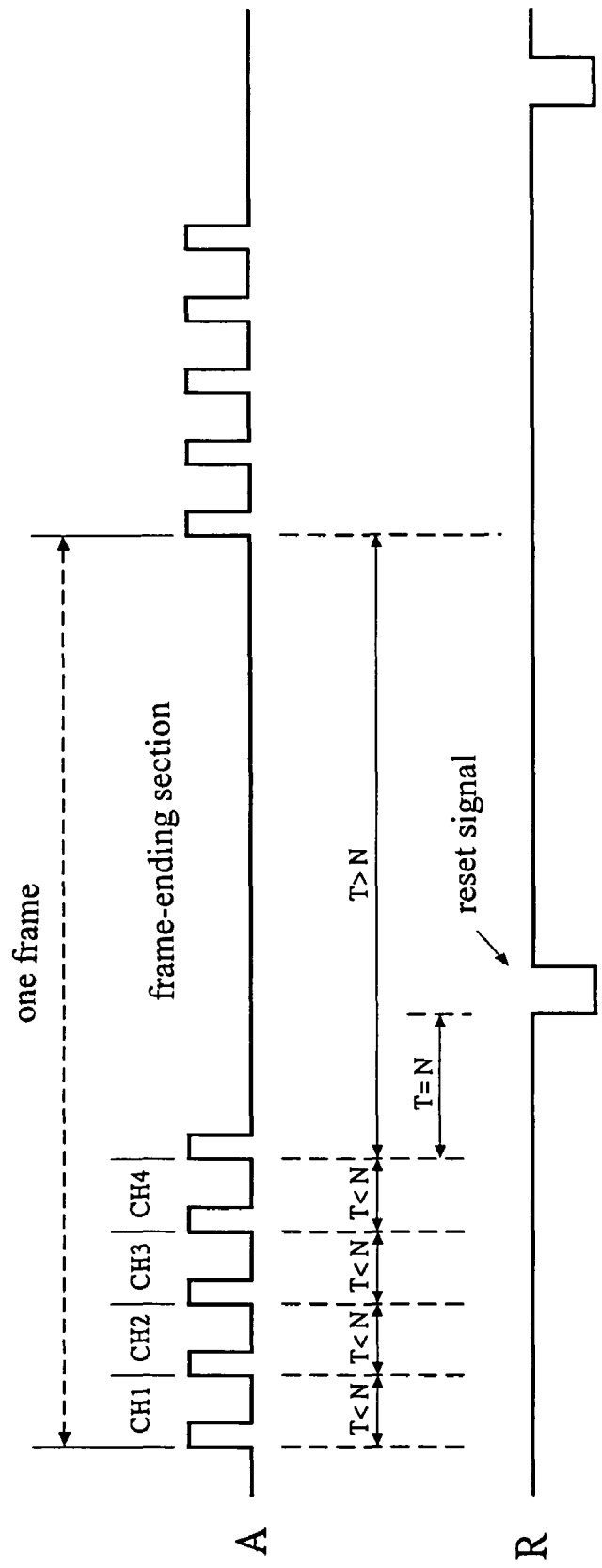
FIG. 4 shows the arrangement and control of the serial data in accordance with the present invention.

Referring to FIG. 4, which shows the arrangement and control of the serial data in accordance with the present invention, no charge and/or discharge waveform is shown, since the serial data decoder of the present invention is not provided with capacitor. The signal A of CH1, CH2, CH3, CH4 are serial data, and the period T of the respective serial data CH1, CH2, CH3, CH4 are similar and less than a given period of time N that is used to detect whether it is in the frame-ending section. If the period T of the respective serial data CH1, CH2, CH3, CH4 is less than the given period of time N, this means that the serial data is still being transmitted. If there is no serial data and the detected period T is equal to the given period of time N, that means it is in the frame-ending section, so a reset signal R will be generated to restart another round of serial transmission.

Figure 5:
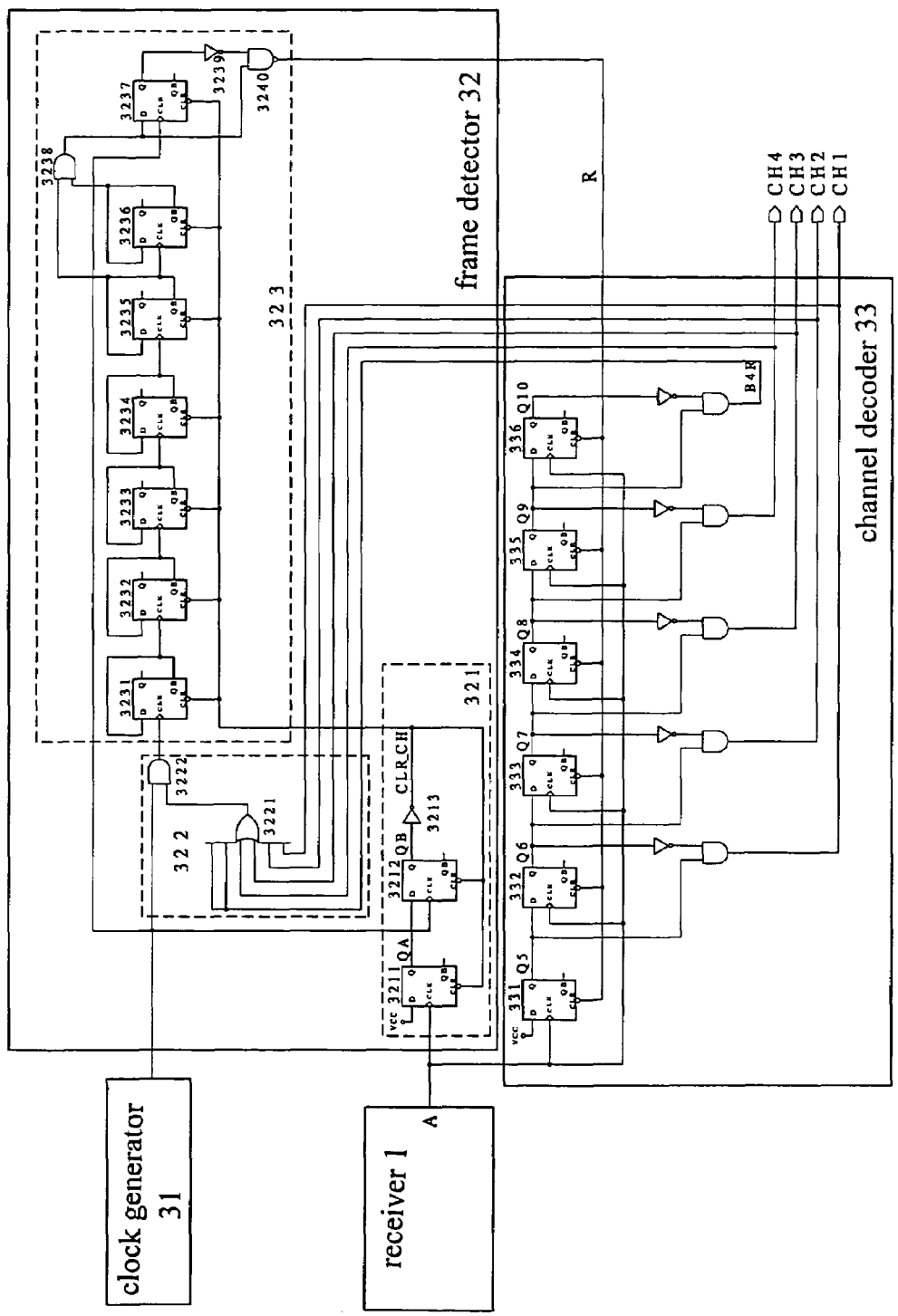
FIG. 5 is a circuit diagram of the serial data decoder in accordance with the present invention.

FIG. 5 is a circuit diagram of the serial data decoder in accordance with the present invention. The demodulated signal A is inputted from the output terminal of the receiver 1 into the frame detector 32 and the channel decoder 33.

Figure 6:
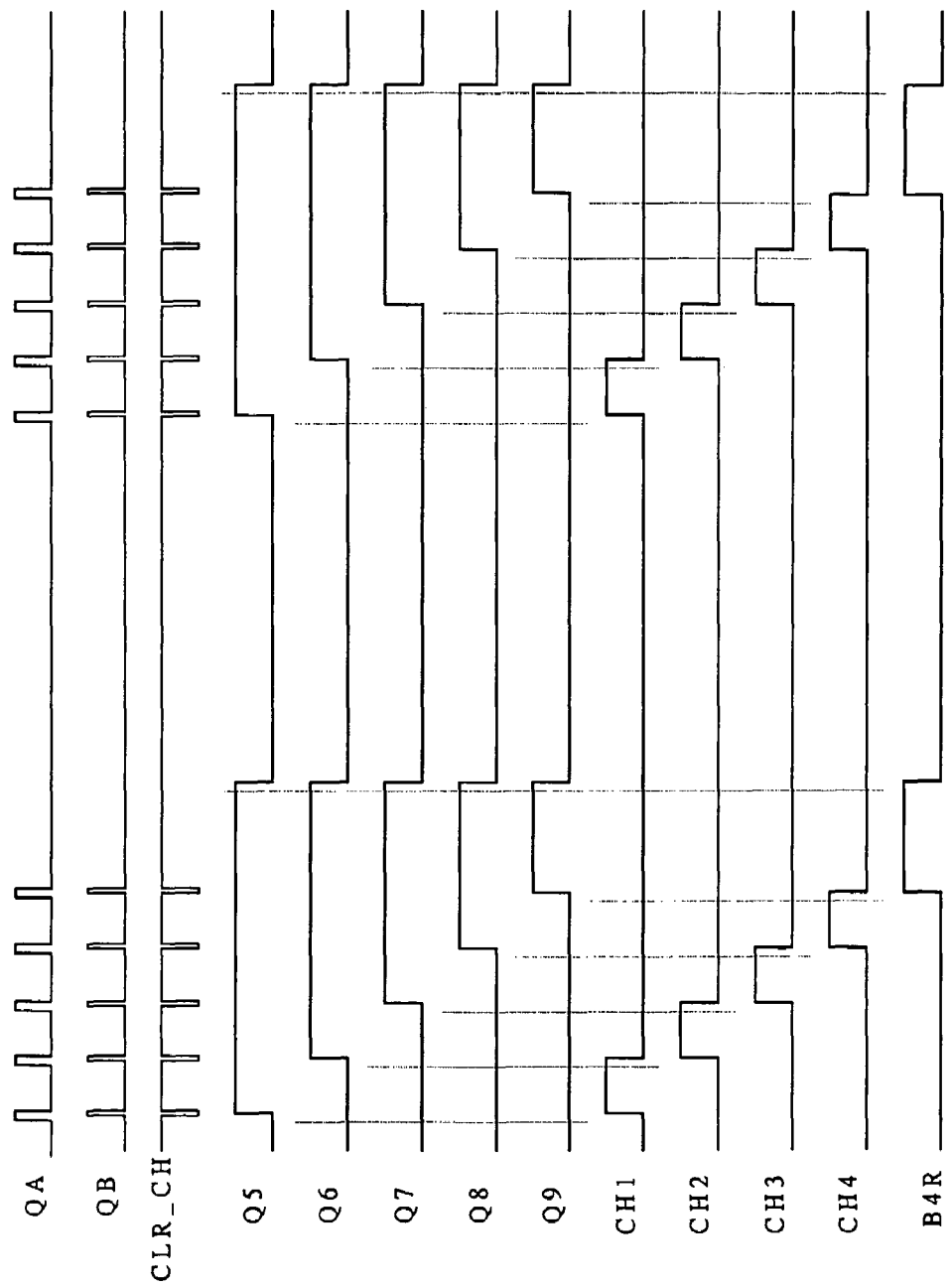
FIG. 6 shows the relative waveforms of the integrated serial data decoder in accordance with the present invention.

The channel decoder 33 comprises six shift registers 331, 332, 333, 334, 335 and 336. After the demodulated-signal A is inputted into the channel decoder 33, the outputs of two consecutive shift registers will be taken out, and then, after passing through an inverter and an AND gate, the parallel data CH1, CH2, CH3, CH4 will be generated, as shown in FIG. 5. The outputs of the shift registers 335 and 336 pass through an inverter and an AND gate to take out the time period B4R of the frame-ending section before the reset signal R. The wavefroms of the outputs Q5, Q6, Q7, Q8 and Q9 of the shift resistors 331, 332, 333, 334 and 335 and the waveforms of signals CH1, CH2, CH3, CH4 and B4R are shown in FIG. 6.

The frame detector 32 includes a counter clear circuit 321, a frame-ending detector 322 and a counter 323.

The frame-ending detector 322 comprises an OR gate 3221 and an AND gate 3222 that are connected as shown. The outputs CH1, CH2, CH3 and CH4 of the channel decoder 33 and the time period B4R are inputted to the OR gate 3221, therefore, in the transmission of the data CH1, CH2, CH3 and CH4 and the time period B4R, the output of the clock generator 31 are inputted to the counter 323. After the reset signal R appears, the output of the clock generator 31 cannot be inputted to the counter 323 due to the data CH1, CH2, CH3 and CH4 and the time period B4R at this moment are zero (as shown in FIG. 6), in this case, the output of the OR gate 3221 and that of the AND gate 3222 are zero.

The counter 323 serves to record time by counting the signal generated by the clock generator 31. The counter 323 includes a plurality of divide-by-two flip-flops 3231, 3232, 3233, 3234, 3235 and 3236 that are connected as shown in FIG. 5, and the number of the divide-by-two flip-flops is determined by the given period of time N shown in FIG. 4. The outputs of the divide-by-two flip-flops 3235 and 3236 are transmitted to a D flip-flop 3237, an inverter 3239 and a NAND gate 3240 after passing through an AND gate 3238, and then a reset signal R is generated and inputted to the clear terminal (CLR) of the shift registers 331, 332, 333, 334, 335 and 336 of the channel decoder 33. When the counter 323 detects the period of time N, this means it is in the time period B4R of frame-ending section, the divide-by-two flip-flops 3235 and 3236 will generate an output that can produce a reset signal R after passing through the AND gate 3238, the D flip-flop 3237, the inverter 3239 and the NAND gate 3240, so that the shift registers 331, 332, 333, 334, 335 and 336 of the channel decoder 33 will be reset by the reset signal R, waiting for the next round of serial data input.

The counter clear circuit 321 includes two D flip-flops 3211 and 3212 and an inverter 3213 and is used to generate clear signal by making use of the data CH1, CH2, CH3 and CH4, so as to reset the flip-flops 3231, 3232, 3233, 3235, 3236 and 3237. The waveforms of the output QA and QB of the D flip-flops 3211 and 3212 and the waveforms of the output CLR_CH of the inverter 3213 are shown in FIG. 6.

While we have shown and described various embodiments in accordance with the present invention, it should be clear to those skilled in the art that further embodiments may be made without departing from the scope of the present invention.

What is claimed is:

1. An integrated serial data decoder without a capacitor, comprising:

a clock generator generating a clock signal;

a channel decoder, receiving a demodulated serial data and converting the demodulated serial data into parallel data periodically and repeatedly, wherein a structure of the demodulated serial data includes a data-transmission section and a frame-ending section, periods of the respective demodulated serial data in data-transmission section are equal to each other and all less than a predetermined period of time N, while the time of the frame-ending section is longer than the predetermined period of time N;

a frame detector receiving the clock signal and detecting the period of the respective demodulated serial data, when no demodulated serial data is detected and the period of the respective demodulated serial data is found to be equal to the predetermined period of time N, generating a reset signal and starting another round of serial data transmission;

the channel decoder receiving the demodulated serial data and comprising a plurality of shift registers, a plurality of inverters and a plurality of AND gates, wherein after the demodulated serial data is inputted to the plurality of shift registers, the outputs of two consecutive shift registers are taken out, and then, after passing through an first inverter and an first AND gate, a set of parallel data is generated, outputs of the last two shift registers are passed through an second inverter and an second AND gate to take out a time period of B4R of the frame-ending section before the reset signal R, and then the channel decoder is reset by the reset signal, wherein the time of a high logical level of the last AND gate is equal to the time period B4R.

2. The integrated serial data decoder as claimed in claim 1, wherein the frame detector includes a counter clear circuit, a frame-ending detector and a counter.

3. The integrated serial data decoder as claimed in claim 2, wherein the frame-ending detector comprises an OR gate and an AND gate, the parallel data is outputted by the channel decoder and the time period of B4R are inputted to the OR gate, therefore, the output of the clock generator is inputted to the counter during the data-transmission section and the time period B4R; after the reset signal is generated, the output of the clock generator is not to be inputted to the counter.

4. The integrated serial data decoder as claimed in claim 2, wherein the counter calculates and records the times of the clock signals that are generated by the clock generator, the numbers of the divide-by-two flip-flop is in the counter are decided by the predetermined period of time N, outputs of last two divide-by-two flip-flops in the counter are transmitted into a D flip-flop and a NAND gate, and then the reset signal is generated by the NAND gate couple with a AND gate and a inventor that receive a signal from the D flip-flop and inputted to clear terminal of the shift registers of the channel decoder, when the predetermined period of time N is detected by the counter, the frame is in the time period of B4R, and then the shift resisters of the channel decoder are reset after the reset signal transmitted in and wait for another round of the serial data input.

5. The integrated serial data decoder as claimed in claim 4, wherein the counter clear circuit includes two D flip-flops and an inverter and is used to generate clear signal by making use of the respective demodulated serial data, so as to reset the divide-by-two flip-flops in the counter.

* * * * *